US008204388B2

(12) United States Patent  
Nagarajan et al.

(10) Patent No.: US 8,204,388 B2  
(45) Date of Patent: Jun. 19, 2012

(54) TRANSIMPEDANCE AMPLIFIER HAVING A SHARED INPUT

(75) Inventors: Radhakrishnan L. Nagarajan, Cupertino, CA (US); Huan-Shang Tsai, Cupertino, CA (US)

(73) Assignee: Infinera Corporation, Sunnyvale, CA (US)

( * ) Notice: Subject to any disclaimer, the term of this patent is extended or adjusted under 35 U.S.C. 154(b) by 157 days.

(21) Appl. No.: 12/496,514

(22) Filed: Jul. 1, 2009

(65) Prior Publication Data

US 2011/0001204 A1  Jan. 6, 2011

(51) Int. Cl.  
*H04B 10/06* (2006.01)

(52) U.S. Cl. .................................. 398/202; 398/214

(58) Field of Classification Search ................ 398/202, 398/214  
See application file for complete search history.

(56) References Cited

U.S. PATENT DOCUMENTS

| | | | |
|---|---|---|---|
| 6,118,397 A | 9/2000 | Heflinger | |
| 2005/0129414 A1* | 6/2005 | Guckenberger et al. | 398/202 |
| 2005/0265732 A1 | 12/2005 | Jennen et al. | |
| 2007/0183738 A1* | 8/2007 | Welch et al. | 385/147 |

OTHER PUBLICATIONS

M. Boudreau et al., "An integrated InP Coherent Receiver for 40 and 100 Gb/sec Telcommunications Systems", OMK6.pdf, OSA/OFC/NFOEC 2009.

Yves Painchaud et al., "Performance of balanced detection in a coherent receiver", Optics Express, vol. 17, No. 5, pp. 3659-3672, Mar. 2, 2009.

R. Kunkel et al., "First Monolithic InP-Based 90°-Hybrid OEIC Comprsing Balanced Detectors for 100GE Coherent Frontends," IEEE, pp. 167-170, 2009.

Tine De Ridder et al., "Monolithic transimpedance amplifier design for large photodiode capacitance and wide temperature range", Proceeding Symposium IEEE/LEOS Benlux Chapter, 2005, Mons, pp. 245-248, 2005.

* cited by examiner

*Primary Examiner* — Evan Pert  
(74) *Attorney, Agent, or Firm* — David L. Soltz

(57) ABSTRACT

Consistent the present disclosure, a receive circuit is provided that includes a balanced detector portion and a transimpedance amplifier (TIA). The anode of one photodiode is connected to the cathode of the other by a bonding pad, which supplies the sum of the currents generated in each photodiode to an input of the TIA. Thus, the TIA may, for example, have a single input, as opposed to multiple inputs, thereby reducing the number of connections so that the photodiodes and the TIA may be integrated onto a smaller die. In addition, since there are few connections, fewer TIAs are required and differential stages are unnecessary. Power consumption is thus reduced, and, since the photodiode current is fed through one input to the TIA, fewer feedback resistors are required, thereby reducing thermal noise. In addition, since the anode of one photodiode is connected to the cathode of the other, the dark current generated in each flows in opposite directions, and is therefore effectively cancelled out. Since one input is provided, impedance matching with other inputs is unnecessary, nor is additional DC biasing circuitry needed. As described in greater detail below, an example of the present disclosure includes a bonding pad, which connects the two photodiodes and provides the input current to the TIA.

26 Claims, 3 Drawing Sheets

TRANSIMPEDANCE AMPLIFIER HAVING A SHARED INPUT

BACKGROUND OF THE DISCLOSURE

So-called "balanced detectors" are known components in optical receiver circuits and typically include a pair of photodiodes that each receives a corresponding portion of an optical signal. The photodiodes may be coupled to respective inputs of a transimpedance amplifier (TIA). Each input is coupled to the output of the TIA via resistor ("feedback resistor"), such that the output voltage of the TIA corresponds to a difference between the currents generated by the photodiodes by the received optical signal portions. The output voltage may then be further processed to determine the information carried by the optical signal.

A TIA, as described above, however, may have several disadvantages. In particular, the number of connections between the photodiodes and the TIA is relatively high. As a result, the design of the TIA and photodiodes may be complicated, and the size of the die on which the TIA, as well as the photodiodes, is provided may be increased. Moreover, each connection may be fed to either a differential stage or to a corresponding TIA. In either case, the TIA/balanced detector may consume excessive power.

Further, the feedback resistors coupled between the TIA inputs and the TIA output have an associated thermal noise, which may be observed in the output voltage of the TIA. Thus, since a relatively high number of inputs are provided, the thermal noise associated with the TIA is also relatively high.

Moreover, each photodiode may supply a dark current, which further increases noise on the output of the TIA.

In addition, a DC offset may be required for each input to the TIA, otherwise the dynamic range of the TIA may be reduced. As a result, additional biasing circuitry may be required. Further, the impedance of each input is preferably matched to each other, but such matching may be difficult to achieve at high frequencies.

Accordingly, there is a need for a TIA in combination with a balanced photodetector that does not suffer from the above-note shortcomings.

SUMMARY OF THE INVENTION

Consistent with an aspect of the present disclosure, a circuit is provided that includes a first photodiode having a cathode and an anode, as well as a second photodiode that has a cathode and an anode. A conductor is provided that extends from the first photodiode to the second photodiode to thereby electrically couple the anode of the first photodiode to the cathode of the second photodiode. The conductor has first, second and third portions, such that the second portion is provided between the first and third portions. The conductor has a length that extends in a first direction in which a current flows from the first photodiode to the second photodiode. Further, the first, second, and third portions, have first, second, and third widths, respectively, that extend in a second direction transverse to the length. The first and third widths are less than the second width. In addition, an amplifier is provided that has an input and an output. The input is electrically coupled to the second portion of the conductor. The amplifier supplies a voltage at the output based on the current.

Consistent with an addition aspect of the present disclosure, a circuit is provided that includes a first photodiode having a p-type region and an n-type region. A second photodiode is also included that has a p-type region and an n-type region. A conductor is provided that extends from the first photodiode to the second photodiode to thereby electrically couple the n-type region of the first photodiode to the p-type region of the second photodiode. The conductor has first, second and third portions, such that the second portion is provided between the first and third portions. The conductor has a length that extends in a first direction in which a current flows from the first photodiode to the second photodiode. Further, the first, second, and third portions, have first, second, and third widths, respectively, that extend in a second direction transverse to the length. The first and third widths are less than the second width. In addition, an amplifier is provided that has an input and an output. The input is electrically coupled to the second portion of the conductor. The amplifier supplies a voltage at the output based on the current.

It is to be understood that both the foregoing general description and the following detailed description are exemplary and explanatory only and are not restrictive of the invention, as claimed.

The accompanying drawings, which are incorporated in and constitute a part of this specification, illustrate one embodiments of the disclosure and together with the description, serve to explain the principles of the invention.

DESCRIPTION OF THE EMBODIMENTS

Consistent the present disclosure, a receive circuit is provided that includes a balanced detector portion and a transimpedance amplifier (TIA). The anode of one photodiode is connected to the cathode of the other by a bonding pad, which supplies the sum of the currents generated in each photodiode to an input of the TIA. Thus, the TIA may, for example, have a single input, as opposed to multiple inputs, thereby reducing the number of connections so that the photodiodes and the TIA may be integrated onto a smaller die. In addition, since there are few connections, fewer TIAs are required and differential stages are unnecessary. Power consumption is thus reduced, and, since the photodiode current is fed through one input to the TIA, fewer feedback resistors are required, thereby reducing thermal noise. In addition, since the anode of one photodiode is connected to the cathode of the other, the dark current generated in each flows in opposite directions, and is therefore effectively cancelled out. Since one input is provided, impedance matching with other inputs is unnecessary, nor is additional DC biasing circuitry needed. As described in greater detail below, an example of the present disclosure includes a bonding pad, which connects the two photodiodes and provides the input current to the TIA.

Reference will now be made in detail to the present exemplary embodiments of the disclosure, examples of which are illustrated in the accompanying drawings. Wherever possible, the same reference numbers will be used throughout the drawings to refer to the same or like parts.

Figure 1:
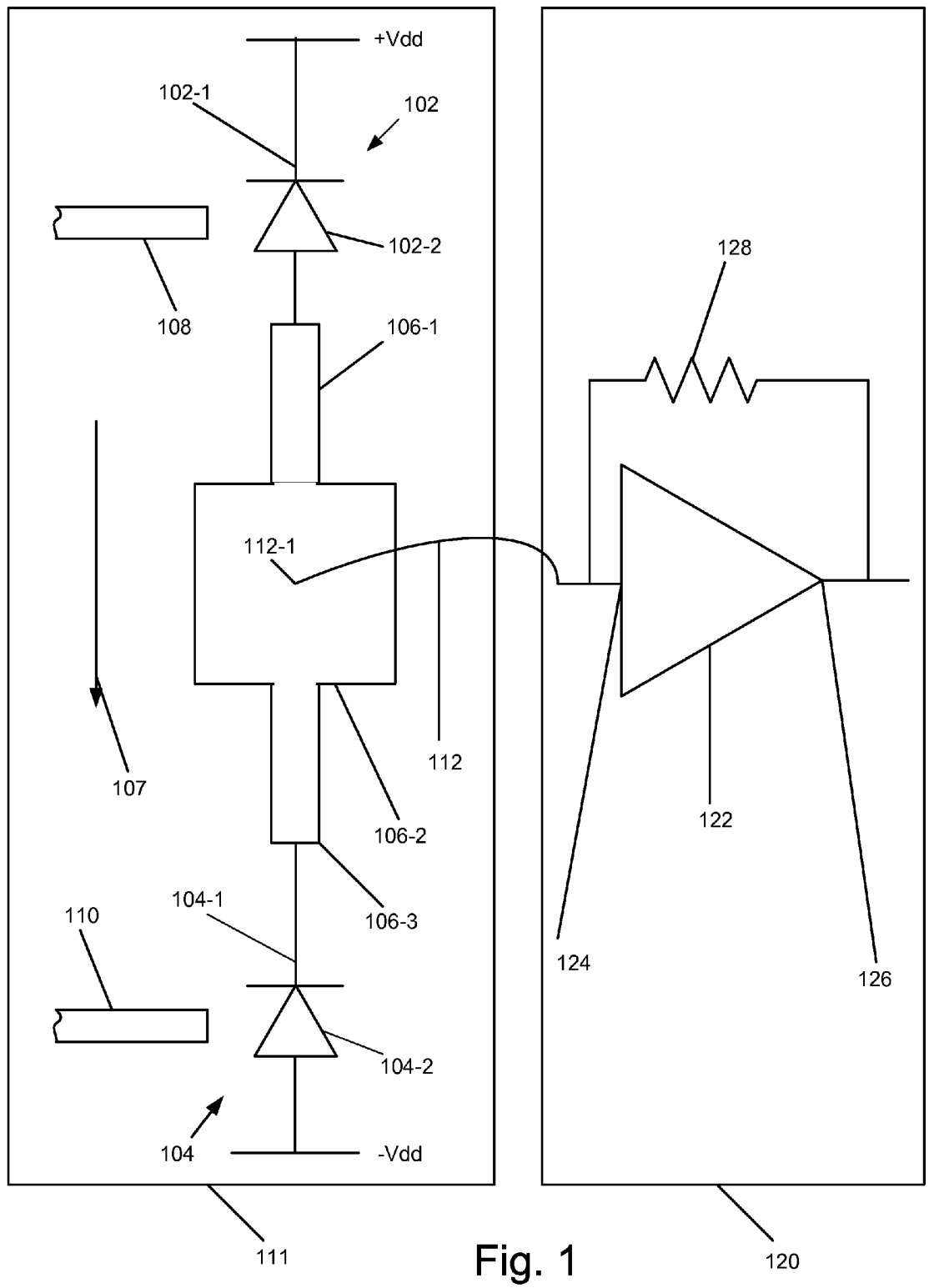
FIG. 1 illustrates a receiver circuit consistent with an aspect of the present disclosure.

FIG. 1 illustrates a receiver circuit consistent with the present disclosure. The receiver includes a first substrate 111 (including indium phosphide, InP, for example) upon which waveguides 108 and 110 may be provided. Waveguides 108 and 110 typically output portions of an incoming optical signal, which has been modulated in accordance with a modulation format. As generally understood, optical circuitry may be provided to, for example, split the incoming optical signal into portions having different polarizations or phase. Waveguides 108 and 110, therefore, may be configured to supply such optical signal portions.

Photodiodes 102 and 104, constituting a balanced detector, are also provided on substrate 111 and receive optical signal portions from waveguides 108 and 110, respectively. Preferably, photodiodes 102 and 104 are reverse biased. For example, cathode 102-1 of photodiode 102 is at a higher potential (Vdd) than anode 102-2, and cathode 104-1 of photodiode 104 is at a higher potential than anode 104-2, which is at −Vdd. As a result, a current or photocurrent is generated in response to the received optical signal portions. Such current flows in a direction indicated by arrow 107.

As further shown in FIG. 1, the current flows through conductor 106 (which in one example, is a known metal, such as gold), that is further provided on substrate 111. Conductor 106 has first (106-1), second (106-2), and third (106-3) portions, such that the width of the first (106-1) and third (106-3) portions is less than the width of second portion 106-2, wherein such widths extend in a direction transverse to direction 107 in which the current flows. Preferably, second portion 106-2 constitutes a bonding pad, whereby a portion 112-1 of a conductor, such as wire 112 may be bonded. Wire 112 electrically connects portion 112-1 with input 124 of transimpedance amplifier (TIA) 122.

TIA 122 is provided on substrate 120 (including silicon, gallium arsenide, or indium phosphide, for example) and operates in a known manner to convert the current supplied to input 124 into a voltage supplied at output 126. In particular, resistor 128 couples output 126 to input 124, such that the voltage at output 126 is equal to the product of the current supplied to input 124 multiplied by the resistance of resistor 128.

Figure 2:
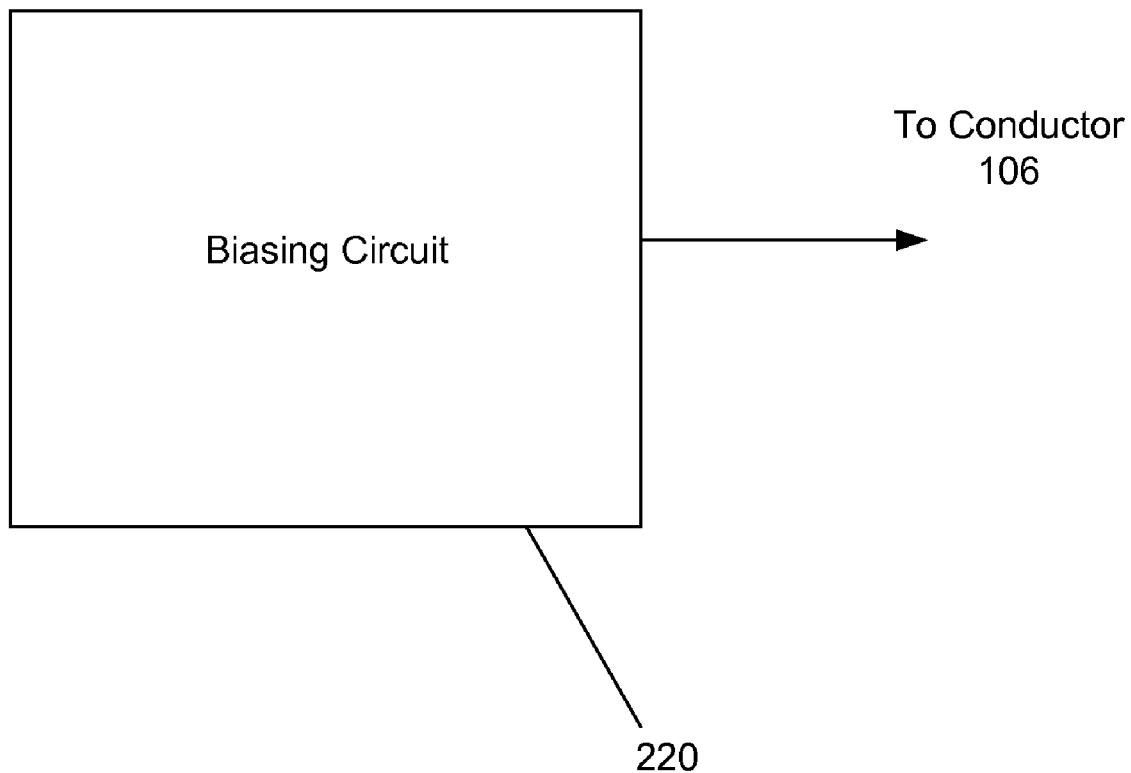
FIG. 2 illustrates a simplified block diagram of a biasing circuit consistent with an additional aspect of the present disclosure.

Preferably, as shown in FIG. 2, a biasing circuit is provided to generate a voltage or potential that is applied to conductor 106, such that both photodiodes 102 and 104 are maintained in a reverse-biased state. The output voltage from TIA 122 may then be processed further to identify or extract data carried by the optical signal portions supplied to the receiver.

Figure 3A:
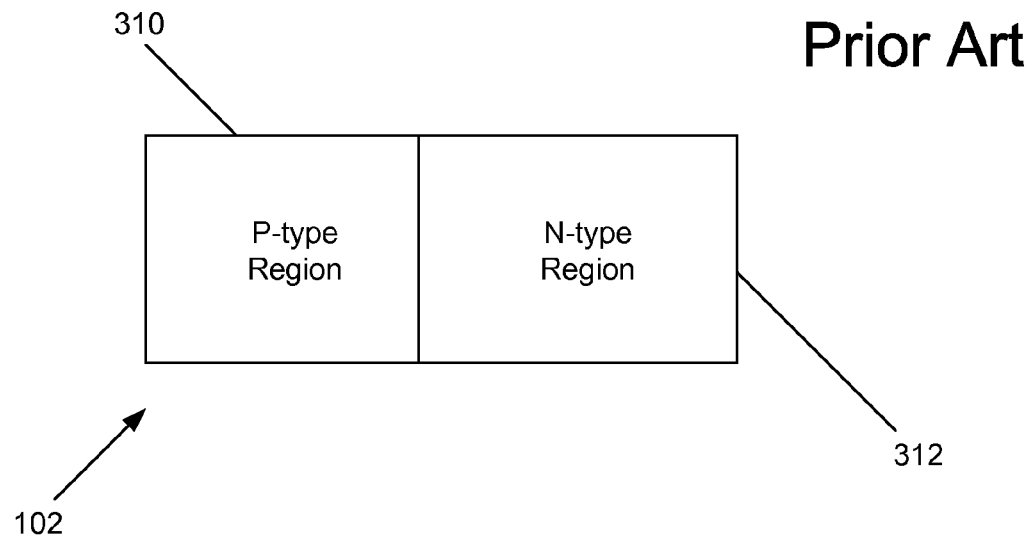
FIGS. 3a and 3b illustrate simplified block diagrams of examples of photodiodes consistent with a further aspect of the present disclosure.
Figure 3B:
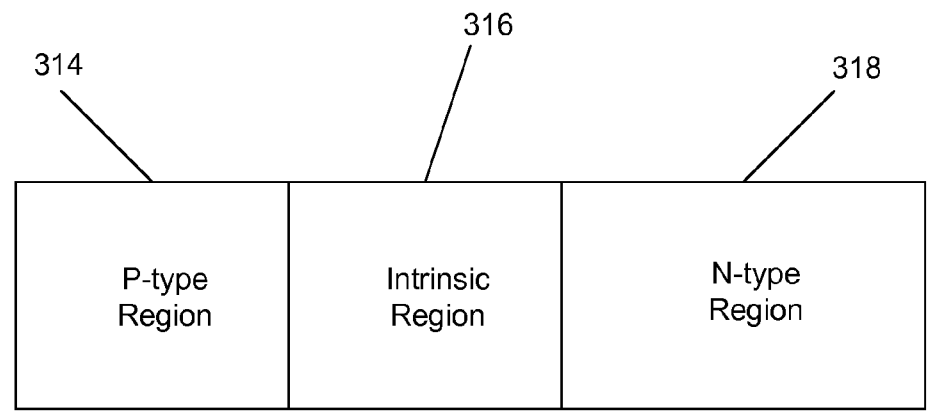

FIGS. 3a and 3b illustrate simplified block diagrams of exemplary structures of photodiode 102. It is understood that photodiode 104 may have the same or similar structure as that of photodiode 102. As shown in FIG. 3a, photodiode 102 includes a p-type semiconductor region 310 and an n-type semiconductor region 312, which form p-n junction in a known manner. Alternatively, as shown in FIG. 3b, photodiode 102 may have a PIN structure, in which p-type semiconductor region 314 and n-type semiconductor region 318 are separated from one another by an intrinsic semiconductor region 316.

As noted above, a receiver circuit consistent with the present disclosure includes a balanced detector having one output that is supplied to the input of a TIA. The output may be realized as a bonding pad which is attached to a conductor, such as a wire, that is connected to the TIA. As further discussed above, by providing one output, reduced power consumption, increased integration, and other advantages may be obtained.

Other embodiments will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A circuit, comprising:
   a first substrate;
   a first photodiode having a cathode and an anode;
   a second photodiode having a cathode and an anode;
   a conductor extending from the first photodiode to the second photodiode to thereby electrically couple the anode of the first photodiode to the cathode of the second photodiode, the conductor having first, second and third portions, such that the second portion constitutes a bonding pad that is provided between the first and third portions, the conductor has a length extending in a first direction in which a current flows from the first photodiode to the second photodiode, and the first portion has a first width, the second portion has a second width, and the third portion has a third width, each of the first, second, and third widths extending in a second direction transverse to the length, the first and third widths being less than the second width;
   an amplifier having an input and an output, the input being electrically coupled to the second portion of the conductor, the amplifier supplying a voltage at the output based on the current; and
   a second substrate, such that the first and second photodiodes and the conductor, including the bonding pad, are provided on the first substrate and the amplifier is provided on the second substrate.

2. A circuit in accordance with claim 1, wherein the amplifier is a transimpedance amplifier.

3. A circuit in accordance with claim 1, wherein the conductor is a first conductor, the circuit further including a second conductor that electrically connects the second portion of the first conductor with the input of the amplifier, wherein the first conductor is different than the second conductor.

4. A circuit in accordance with claim 1, wherein the voltage is proportional to the current.

5. A circuit in accordance with claim 1, further including a first waveguide that supplies a first optical signal portion to the first photodiode, and a second waveguide that supplies a second optical signal portion to the second photodiode.

6. A circuit in accordance with claim 5, wherein the first and second waveguides are provided on the first substrate.

7. A circuit in accordance with claim 3, wherein a portion of the second conductor is attached to the second portion of the first conductor.

8. A circuit in accordance with claim 1, wherein the first substrate includes indium phosphide and the second substrate includes silicon, gallium arsenide, or indium phosphide.

9. A circuit in accordance with claim 1, further including a biasing circuit, the biasing circuit being configured to supply a reference voltage to the conductor so that the first and second diodes are reverse biased.

10. A circuit in accordance with claim 1, wherein the current is a photogenerated current associated with the first and second photodiodes.

11. A circuit in accordance with claim 1, further including a resistor, the resistor being configured to electrically connect the input of the amplifier with the output of the amplifier.

12. A circuit in accordance with claim 1, wherein the conductor includes a metal.

13. A circuit in accordance with claim 1, wherein the cathodes of the first and second photodiodes include an n-type semiconductor.

14. A circuit in accordance with claim 13, wherein the anodes of the first and second photodiodes include p-type semiconductor material.

15. A circuit, comprising:
a first substrate;
a first photodiode including a p-type semiconductor region and an n-type semiconductor region;
a second photodiode including a p-type semiconductor region and an n-type semiconductor region;
a conductor extending from the first photodiode to the second photodiode to thereby electrically couple the p-type semiconductor region of the first photodiode to the n-type semiconductor region of the second photodiode, the conductor having first, second and third portions, such that the second portion constitutes a bonding pad that is provided between the first and third portions, the conductor has a length extending in a first direction in which a current flows from the first photodiode to the second photodiode, and the first portion has a first width, the second portion has a second width, and the third portion has a third width, each of the first, second, and third widths extending in a second direction transverse to the length, the first and third widths being less than the second width;
an amplifier having an input and an output, the input being electrically coupled to the second portion of the conductor, the amplifier supplying a voltage at the output based on the current; and
a second substrate, such that the first and second photodiodes and the conductor, including the bonding pad, are provided on the first substrate and the amplifier is provided on the second substrate.

16. A circuit in accordance with claim 15, wherein the amplifier is a transimpedance amplifier.

17. A circuit in accordance with claim 15, wherein the conductor is a first conductor, the circuit further including a second conductor that electrically connects the second portion of the first conductor with the input of the amplifier, the first conductor being different than the second conductor.

18. A circuit in accordance with claim 15, wherein the voltage is proportional to the current.

19. A circuit in accordance with claim 15, further including a first waveguide that supplies a first optical signal portion to the first photodiode, and a second waveguide that supplies a second optical signal portion to the second photodiode.

20. A circuit in accordance with claim 19, wherein the first and second waveguides are provided on the first substrate.

21. A circuit in accordance with claim 17, wherein a portion of the second conductor is attached to the bonding pad.

22. A circuit in accordance with claim 15, wherein the first substrate includes InGaAs and the second substrate includes silicon or gallium arsenide.

23. A circuit in accordance with claim 15, further including a biasing circuit, the biasing circuit being configured to supply a reference voltage to the conductor so that the first and second diodes are reverse biased.

24. A circuit in accordance with claim 15, wherein the current is photogenerated current associated with the first and second photodiodes.

25. A circuit in accordance with claim 15, further including a resistor that electrically connects the input of the amplifier with the output of the amplifier.

26. A circuit in accordance with claim 15, wherein the conductor includes a metal.

* * * * *